(12) United States Patent
Kanschat

(10) Patent No.: US 7,808,070 B2
(45) Date of Patent: Oct. 5, 2010

(54) POWER SEMICONDUCTOR COMPONENT

(75) Inventor: Peter Kanschat, Bad Sassendorf (DE)

(73) Assignee: Infineon Technologies AG, Neubiberg (DE)

( * ) Notice: Subject to any disclaimer, the term of this patent is extended or adjusted under 35 U.S.C. 154(b) by 407 days.

(21) Appl. No.: 11/839,128

(22) Filed: Aug. 15, 2007

(65) Prior Publication Data

US 2008/0042164 A1   Feb. 21, 2008

(30) Foreign Application Priority Data

Aug. 17, 2006   (DE) ........................ 10 2006 038 479

(51) Int. Cl.
*H01L 27/88* (2006.01)
(52) U.S. Cl. ............................... 257/500; 257/E21.704
(58) Field of Classification Search ................ 257/133, 257/500–505, E21.704
See application file for complete search history.

(56) References Cited

U.S. PATENT DOCUMENTS

| 2004/0248330 | A1 | 12/2004 | Kitabatake et al. |
| 2006/0202264 | A1* | 9/2006 | Bhalla et al. ................. 257/330 |
| 2006/0220061 | A1* | 10/2006 | Shimoida et al. ............ 257/192 |
| 2006/0256487 | A1* | 11/2006 | Kishimoto et al. ............ 361/19 |

* cited by examiner

*Primary Examiner*—Nathan W Ha
(74) *Attorney, Agent, or Firm*—Dicke, Billig & Czaja, PLLC

(57) ABSTRACT

A power semiconductor component is disclosed. One embodiment provides a semiconductor body, in which at least two vertical power semiconductor components are arranged. Each of the vertical power semiconductor components has a first load terminal arranged at a front side of the semiconductor body. Each of the vertical power semiconductor components has a second load terminal arranged at a rear side of the semiconductor body opposite the front side.

25 Claims, 7 Drawing Sheets

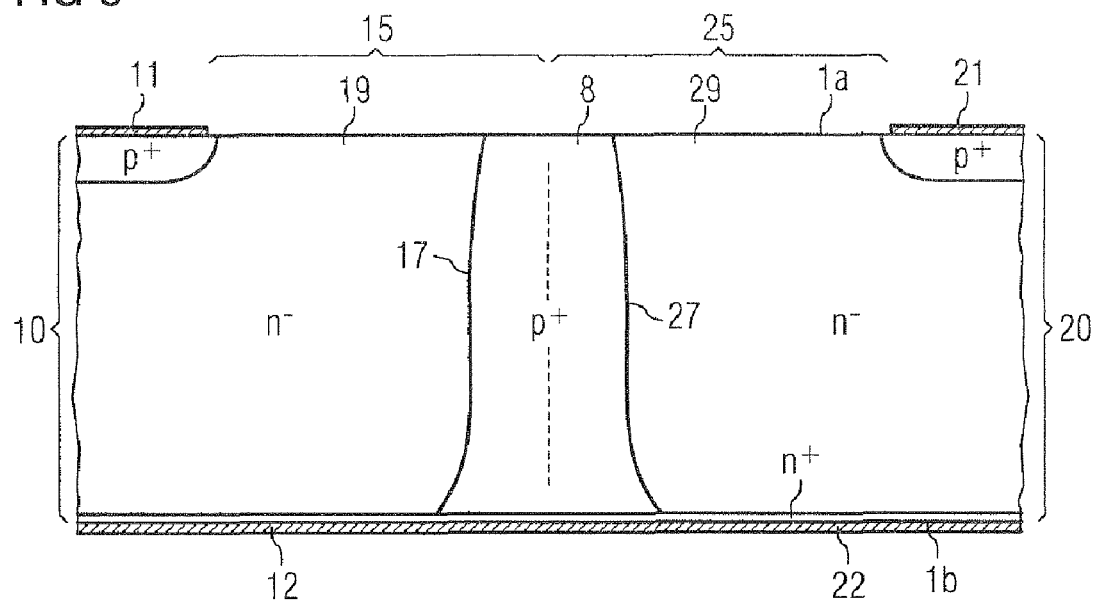
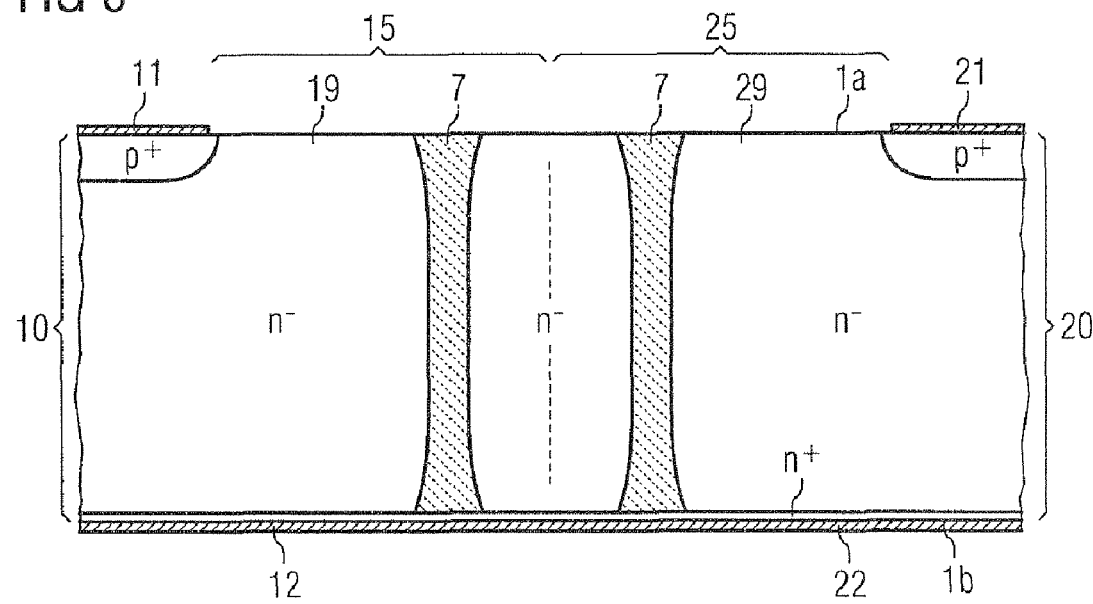

POWER SEMICONDUCTOR COMPONENT

CROSS-REFERENCE TO RELATED APPLICATIONS

This Utility Patent Application claims priority to German Patent Application No. DE 10 2006 038 479.2 filed on Aug. 17, 2007, which is incorporated herein by reference.

BACKGROUND

The invention relates to a power semiconductor component.

In electrical installations, power semiconductor components are typically used for switching high currents and voltages. In one embodiment, the technical realization is regularly effected in the form of power semiconductor modules in which a number of vertical power semiconductor components are arranged on a common substrate, e.g., a planar DCB substrate (DCB=Direct Copper Bonding), in a housing.

In this case, each of the vertical power semiconductor components is connected to a connecting pad of a metallization area of the substrate, for example by soldering. In one embodiment, a plurality of power semiconductor components can be arranged both on mutually separate metallization areas and on a common metallization area.

One disadvantage of an arrangement of this type is that the individual power semiconductor components have to be mounted separately, which requires a correspondingly high manufacturing outlay with correspondingly long process times.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 5 illustrates a vertical section through a portion of the first semiconductor body of a power semiconductor module in accordance with FIG. 1 in the plane B-B' in which power semiconductor components arranged adjacent in the common semiconductor body are electrically decoupled from one another by using two diode junctions.

FIG. 6 illustrates a vertical section through a portion of the first semiconductor body of a power semiconductor module in accordance with FIG. 1 in the plane B-B' in which power semiconductor components arranged adjacent in the common semiconductor body are electrically decoupled from one another by using two dielectric layers.

DETAILED DESCRIPTION

Figure 1:
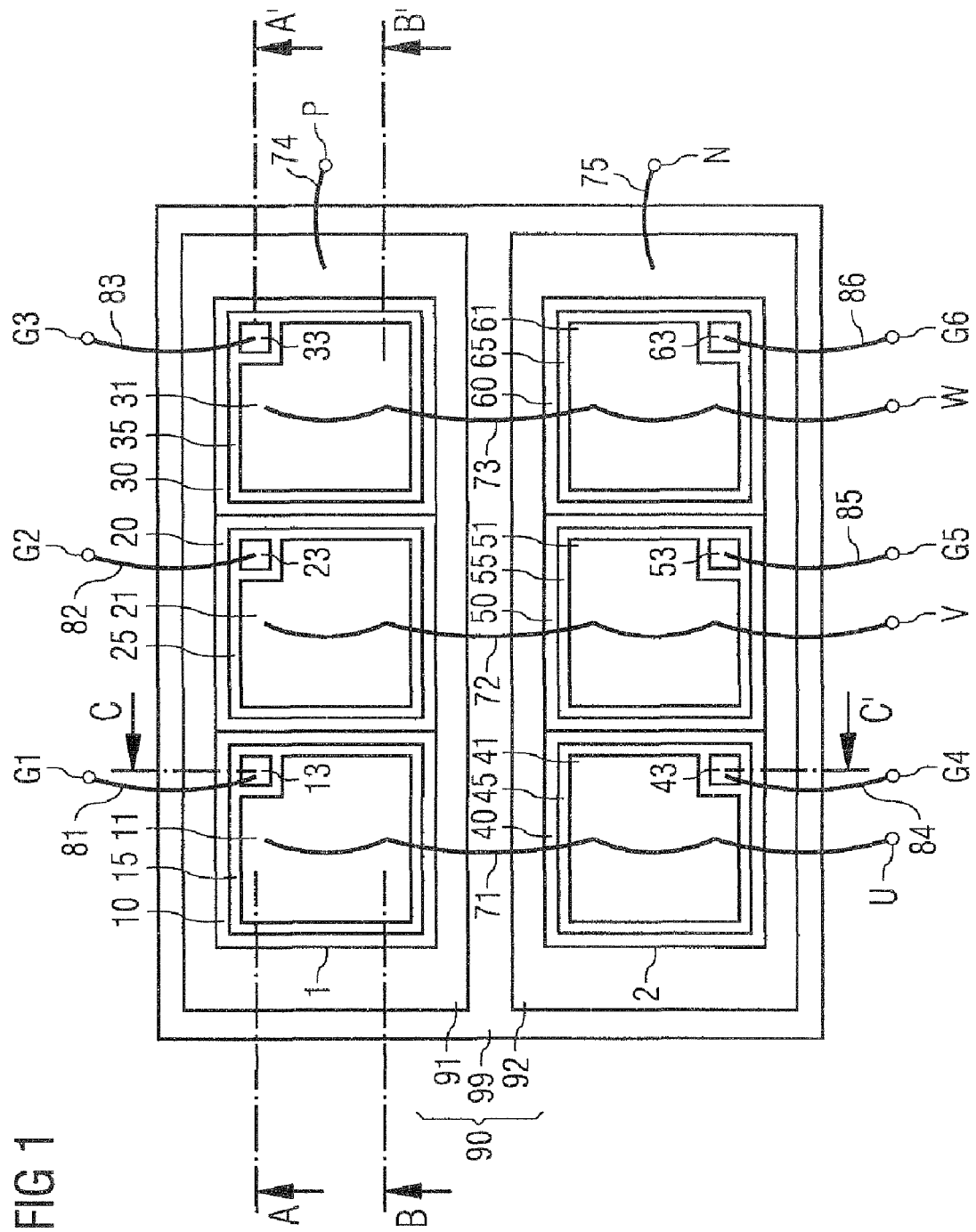
FIG. 1 illustrates a power semiconductor module including a converter bridge circuit with three half-bridges, the upper and lower half-bridge branches of which are formed by a respective controllable vertical power semiconductor component, wherein the three controllable vertical power semiconductor components of the upper half-bridge branches are arranged jointly in a first semiconductor body and the three controllable vertical power semiconductor components of the lower half-bridge branches are arranged jointly in a second semiconductor body.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provides power semiconductor components having the possibility of simple and rapid mounting and also a power semiconductor module having such power semiconductor components.

In one embodiment of the power semiconductor component, at least two vertical power semiconductor components are arranged in a common semiconductor body and can thus be positioned jointly on a substrate and be fixed thereon.

Each of the at least two vertical power semiconductor components has a first load terminal arranged at a front side of the semiconductor body and also a second load terminal arranged at a rear side of the semiconductor body opposite the front side.

The load terminals serve for externally making contact with the vertical power semiconductor components realized in the semiconductor body. They are formed as surface metallizations of the semiconductor body which are applied locally to corresponding terminal regions of the vertical power semiconductor components.

In principle, all controllable, non-controllable, or triggerable power semiconductor components are suitable, in particular diodes, MOSFETs, IGBTs, JFETs and bipolar transistors, provided that they have a vertical construction with two load terminals arranged on mutually opposite sides of the semiconductor body.

Depending on the type of a vertical power semiconductor component, the terminal regions can be in particular drain, source, emitter, collector, anode or cathode zones of the semiconductor body.

Depending on the respective application, it may be necessary for adjacent power semiconductor components from among the vertical power semiconductor components arranged in the common semiconductor body to be electrically decoupled or insulated from one another. In one embodiment, the relevant power semiconductor components can be completely or only partly electrically decoupled or insulated from one another.

In one embodiment, the power semiconductor components integrated in a common semiconductor body have a common semiconductor zone with a common substrate potential. The potential isolation is then in one embodiment effected by electrically blocking structures at the semiconductor surface, for example by using an edge structure surrounding each of the power semiconductor components, such that a potential decrease takes place in the horizontal direction below the edge structure in the semiconductor volume as well.

However, two or more alternately successively arranged p-type and n-type semiconductor zones, which act as a diode or as a diode cascade, are also suitable for decoupling the power semiconductor components arranged in a common semiconductor body. Equally, there is the possibility of providing a non-doped or only lightly doped semiconductor portion having a predetermined width between the power semiconductor components to be decoupled.

Moreover, insulating layers, in particular composed of silicon dioxide or some other semiconductor oxide, preferably oxides or nitrides of the semiconductor material of the semiconductor body, can be used for the purpose of insulation between the semiconductor components.

In the embodiment of only partial decoupling or insulation, specific semiconductor zones of adjacent power semiconductor components arranged in a common semiconductor body can also be connected to one another by a jointly used semiconductor zone of the semiconductor body.

In specific applications it may be desirable that the upper top sides—i.e. top sides remote from the carrier—of two power semiconductor components whose load paths are connected in series are intended to have a common potential. This can be achieved in particular by choosing the power semiconductor components to be complementary to one another, e.g., a pnp component and an npn component or an n-channel component and a p-channel component.

FIG. 1 illustrates a converter bridge circuit of a power semiconductor module including a first semiconductor body 1 and a second semiconductor body 2. The semiconductor bodies 1, 2 are also referred to as "chips". They can be formed from any desired semiconductor material, in particular from silicon.

The arrangement furthermore includes a substrate 90 with a dielectric ceramic carrier 99 having, at least on its top side, a top side metallization with a first metallization portion 91 and a second metallization portion 92.

The first semiconductor body 1 is soldered onto the first metallization portion 91, and the second semiconductor body 2 is soldered onto the second metallization portion 92.

The first semiconductor body 1 has three vertical semiconductor components 10, and 30 arranged in a series alongside one another, and the second semiconductor body 2 has three vertical semiconductor components 40, 50 and 60 arranged in a series alongside one another. Each of the semiconductor components 10, 20, 30, 40, 50, 60 is surrounded by an insulation edge structure 15, 25, 35, 45, 55, 65 on the side remote from the DCB substrate 90.

The semiconductor components 10, 20, 30 of the first semiconductor body 1 are in each case identical n-channel IGBTs having in each case a first load terminal 11, 21 and 31, respectively, and in each case a control terminal 13, 23 and 33, respectively.

The semiconductor components 40, 50, 60 of the second semiconductor body 2 are correspondingly formed as identical p-channel IGBTs having in each case a first load terminal 41, 51 and 61, respectively, and in each case a control terminal 43, 53 and 63, respectively.

Furthermore, the semiconductor components 10, 20, 30, 40, 50, 60 also have, on their side facing the substrate 90, in each case a second load terminal, which is not discernible in the present view. In the present exemplary embodiment, the first load terminals 11, 21, 31, 41, 51, 61 are formed as drain terminals, the second load terminals are formed as source terminals and the control terminals 13, 23, 33, 43, 53, 63 are formed as gate terminals.

In order to produce a triple half-bridge, the first load terminals 11, 21, 31 of the first semiconductor body 1 are electrically conductively connected in pairs to the first load terminals 41, 51 and 61, respectively, of the first semiconductor body 1 e.g., by bonding wires 71, 72 and 73, respectively.

The second load terminals of the semiconductor components 10, 20, 30 are soldered onto the first metallization portion 91 and likewise electrically conductively connected to one another. In the same way, the second load terminals of the semiconductor components 40, 50, 60 are also soldered onto the second metallization portion 92 and electrically conductively connected to one another. As a result of the integration of a plurality of semiconductor components 10, 20, 30 and 40, 50, 60 in a semiconductor body 1 and 2, respectively, these can be e.g., soldered, sintered or adhesively bonded onto the metallization portions 91 and 92, respectively, jointly and in one step.

As a result of this interconnection, a semiconductor component 10, 20, 30 of the first semiconductor body 1 in each case forms together with a semiconductor body 40, 50, 60 of the second semiconductor body 2 a half-bridge (10 with 40, 20 with 50, and 30 with 60). In this case, the semiconductor components 10, 20, 30 form the upper and the semiconductor components 40, 50, 60 the lower branches of the respective half-bridge.

For connecting it up externally, the arrangement has a terminal P for feeding in a positive bridge voltage, a terminal N for feeding in a negative bridge voltage, and also terminals G1, G2, G3, G4, G5 and G6 for feeding in a control voltage to in each case one of the control terminals 13, 23, 33, 43, 53 and 63, respectively. In addition, the output voltages of the triple half-bridge are provided at outputs U, V and W.

The external terminals P, N, G1, G2, G3, G4, G5, G6, U, V and W likewise illustrated in FIG. 1 are electrically conductively connected in the stated order by using bonding wires 74, 75, 81, 82, 83, 84, 85, 86, 71, 72 and 73, respectively, to the corresponding first and second metallization portions 91 and 92, respectively, the top-side control terminals 13, 23, 33, 43, 53 and 63, respectively, and also the top-side load terminals 11, 21, 31, 41, 51 and 61, respectively.

The external terminals P, N, G1, G2, G3, G4, G5, G6, U, V and W can be embodied in different ways depending on the concrete application. In particular, they may be terminal lugs that are led out from a housing (not illustrated in FIG. 1) of the power semiconductor module.

Figure 2:
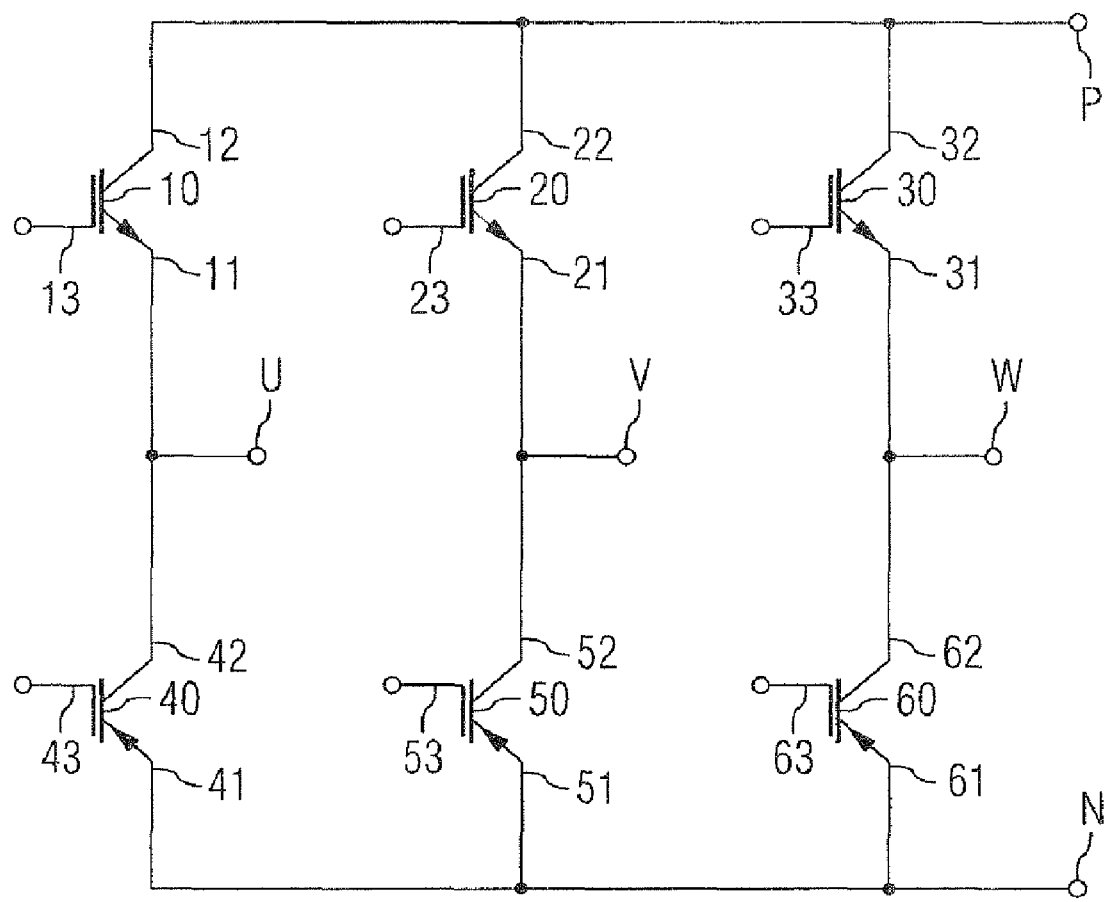
FIG. 2 illustrates a circuit diagram of the converter bridge circuit of the power semiconductor module in accordance with FIG. 1.

FIG. 2 illustrates the circuit diagram of the arrangement in accordance with FIG. 1. Instead of the IGBTs used in the present exemplary embodiment, however, it is also possible to use MOSFETs or other controllable vertical power semiconductor components for realizing a bridge circuit. The controllable vertical power semiconductor components 10, 20, 30, 40, 50, 60 are particularly formed as IGBTs with integrated parallel freewheeling diodes ("reverse conducting IGBTs").

Figure 3:
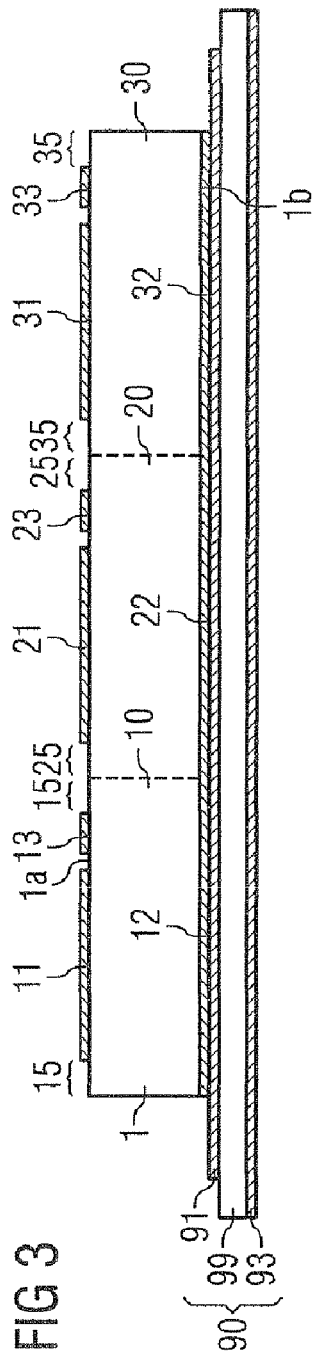
FIG. 3 illustrates a vertical section through the converter bridge circuit of the power semiconductor module in accordance with FIG. 1 in a plane A-A'.

FIG. 3 illustrates a vertical section through the arrangement in accordance with FIG. 1 in a plane A-A'. A dashed vertical line is in each case illustrated as the boundary between the adjacent power semiconductor components from among the power semiconductor components 10, 20, 30 integrated in the common semiconductor body 1. This view also illustrates the second load terminals 12, 22 and 32 (not discernible in FIG. 1) of the power semiconductor components 10, 20 and 30, respectively, which, in accordance with one embodiment of the invention, are formed in one piece as a continuous metallization. The second load terminals 10, 20, 30 can equally be spaced apart from one another and/or electrically insulated from one another.

In the same way, the second load terminals of the power semiconductor components 40, 50, 60 of the second semiconductor body 2 can equally be constructed in one piece as a continuous metallization or in a manner spaced apart from one another and/or electrically insulated from one another.

In the case of power semiconductor components 10, 20, 30 and 40, 50, 60 of a semiconductor body 1 and 2, respectively, that are electrically insulated from one another, the electrical connection is produced by the metallization portions 91 and 92, respectively.

For other circuit arrangements, however, it may be expedient for individual or all of the second load terminals to be electrically decoupled from one another, with the result that specific components from among the power semiconductor components can be connected up entirely or partly separately. For this purpose, the power semiconductor components 10, 20 30 have insulation edge structures 15, 25 and 35, respectively.

In principle, one or more of the multiple semiconductor components can also be applied to the substrate 90 by their first load terminals 11, 21, 31, 41, 51, 61 and by their control terminals 13, 23, 33, 43, 53, 63 instead of by their second load terminals 12, 22, 32, 42, 52, 62 (flip-chip mounting).

Figure 4:
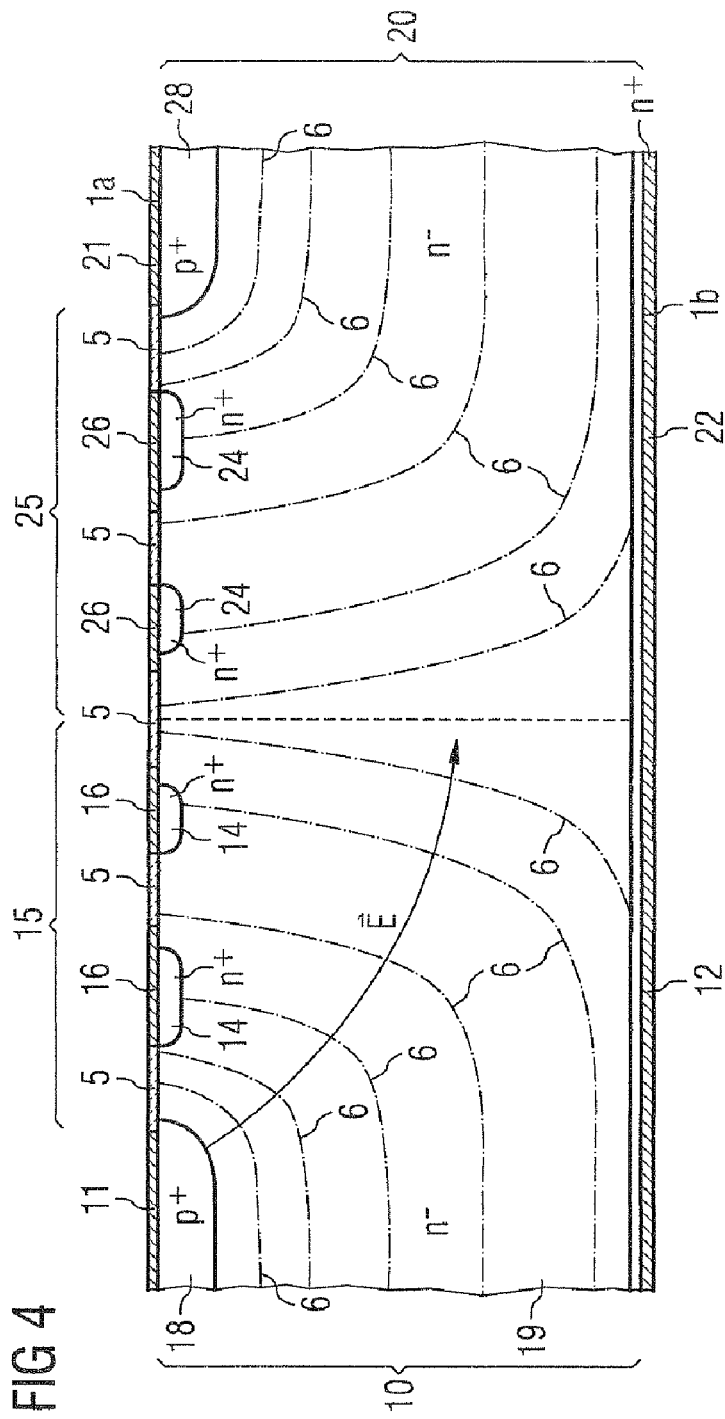
FIG. 4 illustrates a vertical section through a portion of the first semiconductor body of the power semiconductor module in accordance with FIG. 1 in a plane B-B' in which power semiconductor components arranged adjacent in the common semiconductor body are electrically decoupled from one another by using a field ring/field plate structure.

FIG. 4 illustrates a vertical section through a portion of the first semiconductor body 1 of the arrangement in accordance with FIG. 1 in a plane B-B' in the transition region between the first and second power semiconductor component 10 and 20, respectively, having such insulation edge structures 15 and 25, respectively. The first power semiconductor component 10 includes a drift zone 19 adjoined by a heavily p-doped zone 18, with which the load terminal 11 makes contact. The second power semiconductor component 20 correspondingly includes a drift zone 29 adjoined by a heavily p-doped zone 28, with which the load terminal 21 makes contact. The drift zones 19 and 29 together form a weakly n-doped semiconductor zone that is common to the first and second power semiconductor components 10 and 20.

The insulation edge structure 15 of the first power semiconductor component 10 has an edge structure formed as a field ring/field plate structure with field rings 14 and field plates 16. The second power semiconductor component 20 correspondingly includes a field ring/field plate structure with field rings 24 and field plates 26. Each of the electrically conductive field plates, which are formed from polysilicon or aluminium, makes contact with one of the field rings doped complementarily with respect to the weakly n-doped drift zone on the top side of the semiconductor body 1.

In the case where a reverse voltage is present at the respective component, such a field ring/field plate structure brings about a controlled decrease in the electric field in the edge region of the component, thereby avoiding voltage spikes and associated voltage breakdowns in the lateral edge region of the respective power semiconductor component. Below an edge structure of this type, a potential decrease is effected in the semiconductor volume in the horizontal direction as well.

FIG. 4 illustrates by way of example some equipotential lines 6 and also a field line of the resultant electric field E.

In the exemplary embodiment in accordance with FIG. 4, the field ring/field plate structures have in each case two pairs having in each case one field ring and in each case one field plate. In principle, the number of field ring/field plate pairs of a power semiconductor component 10, 20, 30 can be chosen as desired, however.

FIG. 5 illustrates a portion of the semiconductor body 1 corresponding to FIG. 4, although here a diode structure having pn junctions 17 and 27 is provided instead of a field ring/field plate structure for the electrical decoupling of the adjacent power semiconductor components 10, 20. In general, the number of pn junctions arranged between two load terminals 11, 21 is any desired number.

The pn junctions 17, 27 are in one embodiment produced by using an isolating zone 8 doped complementarily with respect to a basic doping ("n-" in the present exemplary embodiment) of the semiconductor body 1. The isolating zone 8 extends continuously and without any interruptions between the front side 1*a* and the rear side 1*b* of the semiconductor body 1.

Such an isolating zone 8 can be produced e.g., by using a masked implantation and/or by using a masked indiffusion of suitable dopants into the semiconductor body 1 and by using a subsequent drive-in heat treatment step. The masked implantation and/or indiffusion is in one embodiment performed on both sides, i.e. proceeding from the front side 1*a* and from the rear side 1*b*.

FIG. 6 also illustrates a portion of the semiconductor body 1 corresponding to FIG. 4, but here a diode structure having, by way of example, two isolating dielectrics 7 spaced apart from one another is provided instead of a field ring/field plate structure for the electrical decoupling of the adjacent power semiconductor components 10, 20. In principle, however, the number of isolating dielectrics 7 arranged between two load terminals 11, 21 is any desired number.

The isolating dielectrics 7 are formed as continuous dielectric layers extending continuously and without any interruptions between the front side 1*a* and the rear side 1*b* of the semiconductor body 1.

In particular, oxides and/or nitrides of the basic material of the semiconductor body, such as e.g., silicon dioxide or tetraethyl orthosilicate (TEOS), are suitable as dielectric.

Insulation edge structures 15, 25, 35, 45, 55, 65 in accordance with FIGS. 1, 3 and 4 which have a field ring/field plate edge structure such as has been explained e.g., with reference to FIG. 4 are in one embodiment arranged in ring-shaped fashion around the front-side and/or rear-side load terminals 11, 12, 21, 22, 31, 32, 41, 42, 51, 52, 61 and 62 of the relevant power semiconductor components 10, 20, 30, 40, 50 and 60, respectively.

By contrast, in the case of insulation edge structures 15, 25, 35, 45, 55, 65 in accordance with FIGS. 1 and 3 which have an isolating zone 8 in accordance with FIG. 5 and/or an isolating dielectric 8 in accordance with FIG. 6, it is sufficient if they are arranged only in the region of the boundary between adjacent power semiconductor components 10, 20, 30, 40, 50 and 60.

Figure 7:
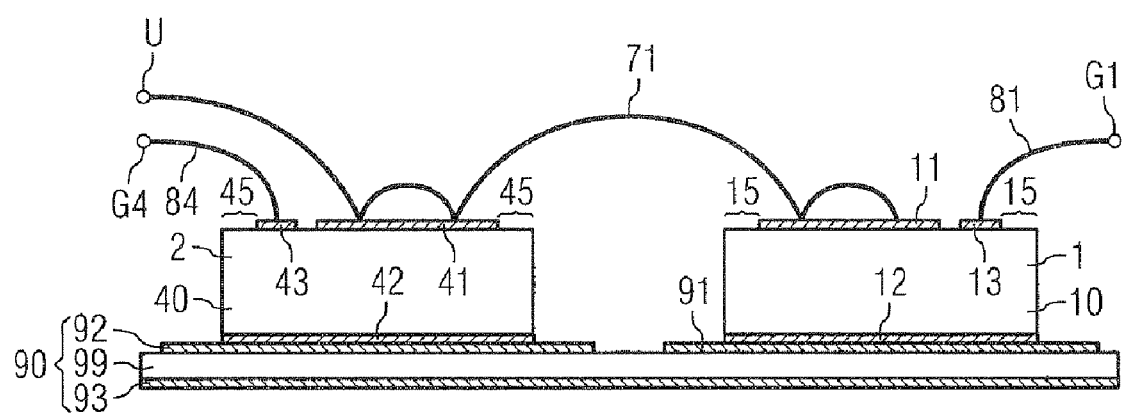
FIG. 7 illustrates a vertical section through the power semiconductor module in accordance with FIG. 1 in a plane C-C'.

FIG. 7 illustrates a vertical section through the arrangement in accordance with FIG. 1 in a plane C-C' through the vertical power semiconductor components 10 and 40. It can be discerned here that the load paths of the vertical power semiconductor components 10, 40 are interconnected to form a half-bridge.

In the arrangement in accordance with FIG. 1, in accordance with one embodiment of the invention, the power semiconductor components 10, 20, 30 of the upper half-bridge branches, on the one hand, and the power semiconductor components 40, 50, 60 of the lower half-bridge branches, on the other hand, are formed as mutually complementary power semiconductor components. Complementary in this sense is understood to mean n-channel components in relation to p-channel components or npn transistors in relation to pnp transistors.

Instead of the triple half-bridge illustrated in FIG. 1, it is also possible, of course, for double half-bridges (H bridges) or multiple half-bridge circuits having more than three half-bridges to be interconnected with one another in a corresponding manner.

In general, the vertical power semiconductor components integrated in a semiconductor body can be constructed in any desired manner also electrically independently of one another and be interconnected with one another as required.

The electrically conductive connections required in this case can be produced by a wide variety of measures, e.g., by using bonding connections, by using soldering the semiconductor body onto a conductor track structure, by using pressure contact-connections of the first and/or second load terminals on the top side and/or on the underside, or by using a film structure laminated onto the semiconductor body with flexible conductor tracks.

In general, in the case of a multiple power semiconductor component according to the invention, it is also possible for non-controllable vertical power semiconductor components such as e.g., diodes to be provided instead of or in addition to controllable vertical power semiconductor components.

By way of example, it is possible, in order to produce a B6 diode bridge proceeding from the arrangement in accordance with FIGS. 1, 3 and 7, to replace the controllable vertical power semiconductor components 10, 20, 30, 40, 50, 60 by vertical power diodes. In this case, the control terminals 13, 23, 33, 43, 53, 63 and also their external terminals G1, G2, G3, G4, G5, G6 and also the bonding wires 81, 82, 83, 84, 85, 86 would be omitted.

If, by way of example, the first load terminals 11, 21, 31 and also the second load terminals 42, 52, 62 form the anodes and the first load terminals 41, 51, 61 and also the second load terminals 12, 22, 32 form the cathodes of the diodes, the diodes of such a B6 diode bridge can serve as freewheeling diodes for the converter circuit described in FIGS. 1 to 7.

Figure 8:
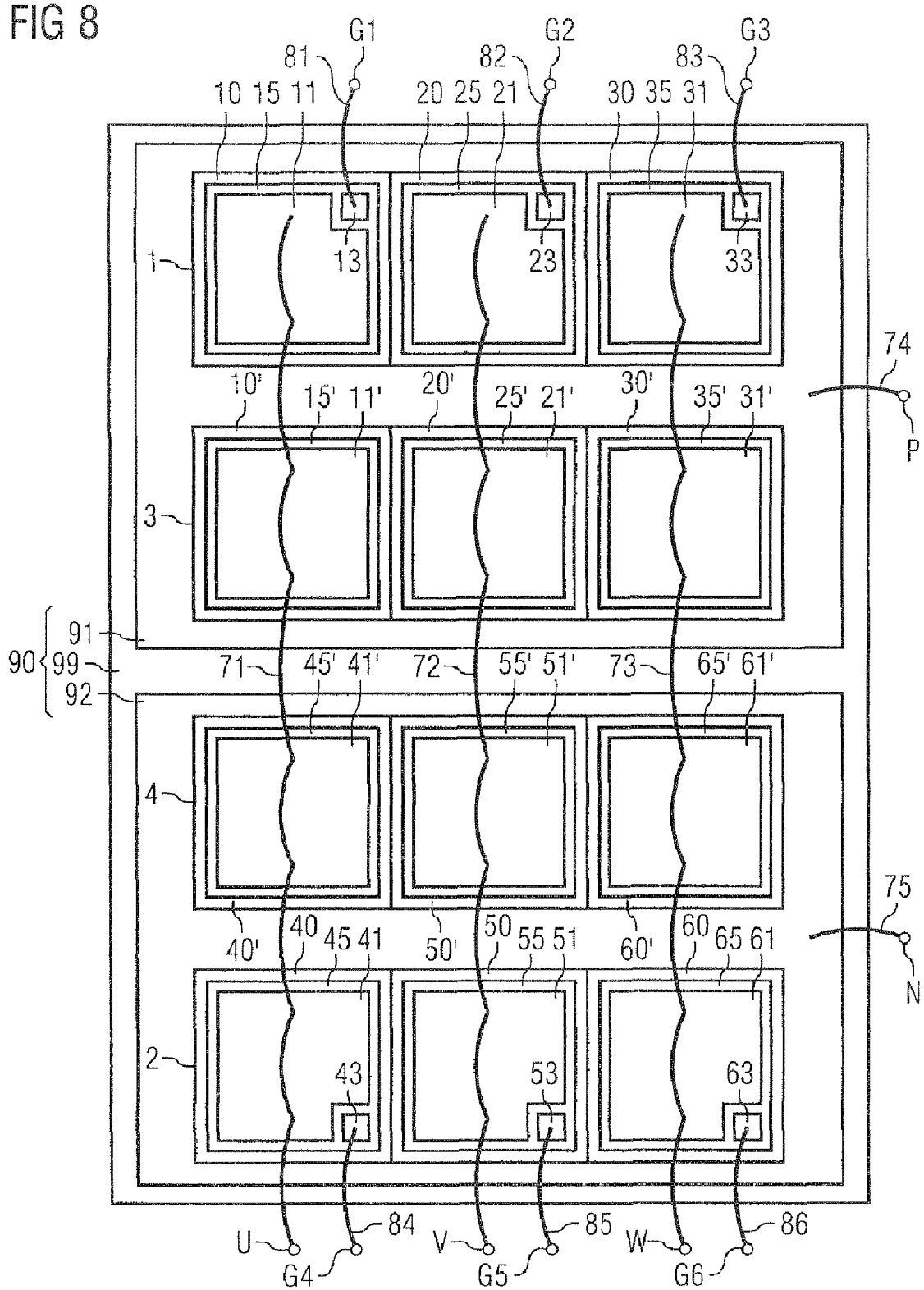
FIG. 8 illustrates a power semiconductor module including a converter bridge circuit in accordance with FIG. 1 which additionally has a third and a fourth semiconductor body with in each case three vertical power diodes.
Figure 9:
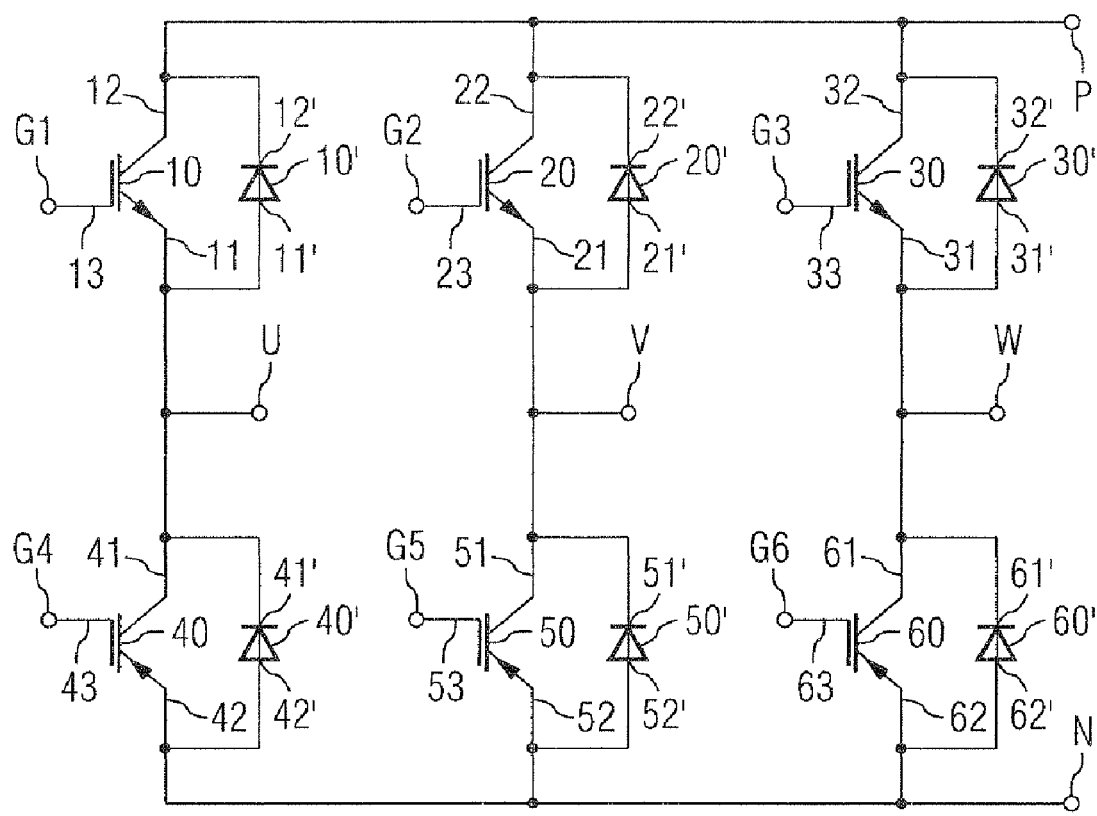
FIG. 9 illustrates a circuit diagram of the arrangement in accordance with FIG. 8.

A further exemplary embodiment is illustrated in FIGS. 8 and 9. The arrangement corresponds to the triple bridge arrangement in accordance with FIGS. 1 to 7. Therefore, all the explanations concerning FIGS. 1 to 7 correspondingly also apply to the arrangement in accordance with FIGS. 8 and 9.

As a difference with regard to the exemplary embodiment in accordance with FIGS. 1 to 7, freewheeling diodes 10', 20', 30', 40', 50' and 60' are also provided in the exemplary embodiment in accordance with FIGS. 8 and 9.

For this purpose, in addition to the first semiconductor body 1 a third semiconductor body 3 is soldered onto the first metallization area 91, the third semiconductor body including the three vertical freewheeling diodes 10', 20', 30' having first connecting pads 11', 21', 31' and also second connecting pads 12', 22', 32', the second connecting pads being arranged between the third semiconductor body 3 and the DCB substrate 90 and not being visible in the present view.

Furthermore, in addition to the second semiconductor body 2 a fourth semiconductor body 4 is soldered onto the second metallization area 92, the fourth semiconductor body including the three vertical freewheeling diodes 40', 50', 60' having first connecting pads 41', 51', 61' and also second connecting pads 42', 52', 62', the second connecting pads being arranged between the fourth semiconductor body 4 and the DCB substrate 90 and not being visible in the present view.

Each of the freewheeling diodes 10', 20', 30', 40', 50' 60' is surrounded by an insulation edge structure 15', 25', 35', 45', 55', 65' on its side remote from the DCB substrate 90.

The first connecting pads 11', 21', 31' and the second connecting pads 42', 52', 62' constitute the anodes and the second connecting pads 12', 22', 32' and the first connecting pads 41', 51', 61' constitute the cathodes of the diodes 10', 20', 30', 40', 50', 60'.

In the same way as in the case of the first and second semiconductor bodies 1 and 2, respectively, in accordance with one preferred embodiment, the second connecting pads 12', 22', 32' facing the DCB substrate 90 are formed in one piece, in the same way as the second connecting pads 42', 52', 62'.

On the top side, the first connecting pads of the controllable semiconductor components and diodes of a respective one of the three half-bridges are electrically conductively connected by using bonding wires 71, 72 and 73, respectively.

In the case of an arrangement in accordance with FIG. 8, instead of twelve individual semiconductor components of a corresponding known arrangement, only 4 semiconductor bodies 1, 2, 3 and 4 have to be applied to the DCB substrate 90.

As can furthermore be seen from FIGS. 8 and 9, one of the power diodes 10', 20', 30' of the third semiconductor body 3 is in each case connected in series with one of the power diodes 40', 50', 60' of the fourth semiconductor body 4 (B2 bridge). The arrangement therefore has three B2 bridges 10'/40', 20'/50' and 30'/60'.

In all the arrangement possibilities explained above, further additional semiconductor elements such as e.g., braking chopper switching elements or switches for power factor correction (PFC switches) can also be integrated into the semiconductor bodies 1, 2, 3 and 4.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor component comprising:
a first semiconductor body, in which at least two vertical power semiconductor components of a first type are arranged, wherein each of the vertical power semiconductor components has a first load terminal arranged at a front side of the semiconductor body and a second load terminal arranged at a rear side of the semiconductor body opposite the front side; and a second semiconductor body, in which at least two vertical power semiconductor components of a second type are arranged, wherein each of the vertical power semiconductor components has a first load terminal arranged at a front side of the semiconductor body and a second load terminal arranged at a rear side of the semiconductor body opposite the front side, wherein the first and second load terminals of each of the at least two power semiconductor components of the first semiconductor body are interconnected with the first and second load terminals of a corresponding one of the at least two power semiconductors of the second semiconductor body to form at least two half-bridge circuits.

2. The semiconductor component of claim 1, in which the second load terminals of the at least two vertical semiconductor components of the first semiconductor body are electrically conductively connected to one another and the second load terminals of the at least two vertical semiconductor components of the second semiconductor body are electrically conductively connected to one another.

3. The semiconductor component of claim 1, wherein the second load terminals of the at least two vertical semiconductor components of the first semiconductor body form a common load terminal and the second load terminal of the at least two vertical semiconductor components of the second semiconductor body from a common load terminal.

4. The semiconductor component of claim 1, wherein the power semiconductor components of the first semiconductor body have a common semiconductor zone and the power semiconductor components of the second semiconductor body have a common semiconductor zone.

5. The semiconductor component of claim 1, wherein adjacent power semiconductor components from among the at least two power semiconductor components arranged in the first semiconductor body are electrically decoupled from one another and adjacent power semiconductor components from among the at least two power semiconductor components arranged in the second semiconductor body are electrically decoupled from one another.

6. The semiconductor component of claim 5, wherein at least one of the adjacent power semiconductor components of each of the first and second semiconductor bodies has a field ring/field plate structure for decoupling purposes.

7. The semiconductor component of claim 5, wherein at least one of the adjacent power semiconductor components of each of the first and second semiconductor bodies has a diode junction for decoupling purposes, which diode junction extends continuously between the front side and the rear side.

8. The semiconductor component of claim 5, wherein at least one of the adjacent power semiconductor components of each of the first and second semiconductor bodies has an isolating dielectric for decoupling purposes, which isolating dielectric extends continuously between the front side and the rear side.

9. The semiconductor component of claim 1, wherein at least one of the power semiconductor components of each of the first and second semiconductor bodies is formed as an IGBT, MOSFET, JFET, thyristor, bipolar transistor or Darlington transistor.

10. The semiconductor component of claim 1, wherein at least one of the power semiconductor components of each of the first and second semiconductor bodies is formed as an IGBT with an integrated parallel freewheel diode (reverse conducting IGBT).

11. The semiconductor component of claim 1, wherein a further semiconductor switch is additionally integrated into each of the first and second semiconductor bodies.

12. The semiconductor component of claim 11, wherein the further semiconductor switch is formed as a braking chopper switching element or as a switch for power factor correction.

13. The semiconductor component of claim 1, wherein at least one of the power semiconductor components of each of the first and second semiconductor bodies is formed as a vertical power diode.

14. A power semiconductor module comprising:
two multiple semiconductor components, each comprising a semiconductor body, in which at least two vertical power semiconductor components are arranged, wherein each of the vertical power semiconductor components has a first load terminal arranged at a front side of the semiconductor body, and each of the vertical power semiconductor components has a second load terminal arranged at a rear side of the semiconductor body opposite the front side;
where the semiconductor body of one multiple semiconductor component has three controllable semiconductor components of a first type and a semiconductor body of the other multiple semiconductor component has three controllable semiconductor components of a second type, wherein each of the load paths of the controllable semiconductor elements of the first type are connected in series with one of the load paths of a controllable semiconductor element of the second type to form a total of three half-bridges.

15. The power semiconductor module of claim 14, comprising wherein the controllable semiconductor switches of the first type are formed as vertical p-channel MOSFETs and the controllable semiconductor switches of the second type are formed as vertical n-channel MOSFETS.

16. The power semiconductor module of claim 14, comprising wherein the controllable semiconductor switches of the first type are formed as vertical p-channel IGBTs and the controllable semiconductor switches of the second type are formed as vertical n-channel IGBTs.

17. The power semiconductor module of claim 14, having two multiple semiconductor components, in the semiconductor bodies of which in each case at least one vertical power diode is arranged wherein each of the vertical power diodes of one semiconductor body is connected in series with a vertical power diode of the other semiconductor body.

18. A power semiconductor component comprising:
a first semiconductor body in which at least two vertical power semiconductor components arranged in the semiconductor body, wherein each of the vertical power semiconductor components has a first load terminal arranged at a front side of the semiconductor body and a second load terminal arranged at a rear side of the semiconductor body opposite the front side; and
a second semiconductor body, in which at least two vertical power semiconductor components of a second type are arranged, wherein each of the vertical power semiconductor components has a first load terminal arranged at a front side of the semiconductor body and a second load terminal arranged at a rear side of the semiconductor body opposite the front side, wherein the first and second load terminals of each of the at least two power semiconductor components of the first semiconductor body are interconnected with the first and second load terminals of a corresponding one of the at least two power semiconductors of the second semiconductor body to form at least two half-bridge circuits.

19. The semiconductor component of claim 18, in which the second load terminals of the at least two vertical semiconductor components of the first semiconductor body are electrically conductively connected to one another and the second load terminals of the at least two vertical semiconductor components of the second semiconductor body are electrically conductively connected to one another.

20. The semiconductor component of claim 18, comprising wherein the second load terminals form a common load terminal.

21. The semiconductor component of claim 18, wherein the power semiconductor components of the first semiconductor body have a common semiconductor zone and the power semiconductor components of the second semiconductor body have a common semiconductor zone.

22. The semiconductor component of claim 18, wherein adjacent power semiconductor components from among the at least two power semiconductor components arranged in a the first semiconductor body are electrically decoupled from one another and adjacent power semiconductor components from among the at least two power semiconductor components arranged in the second semiconductor body are electrically decoupled from one another.

23. The semiconductor component of claim 22, wherein at least one of the adjacent power semiconductor components of each of the first and second semiconductor bodies has a field ring/field plate structure for decoupling purposes.

24. The semiconductor component of claim 22, comprising wherein at least one of the adjacent power semiconductor components of each of the first and second semiconductor bodies has a diode junction for decoupling purposes, which diode junction extends continuously between the front side and the rear side.

25. The semiconductor component of claim 22, wherein at least one of the adjacent power semiconductor components of each of the first and second semiconductor bodies has an isolating dielectric for decoupling purposes, which isolating dielectric extends continuously between the front side and the rear side.

* * * * *